US007046053B2

(12) United States Patent
Nicholas

(10) Patent No.: US 7,046,053 B2
(45) Date of Patent: May 16, 2006

(54) TOTAL HARMONIC DISTORTION STANDARD

(75) Inventor: Ricardo A. Nicholas, Kent, WA (US)

(73) Assignee: The Boeing Company, Chicago, IL (US)

( * ) Notice: Subject to any disclaimer, the term of this patent is extended or adjusted under 35 U.S.C. 154(b) by 1 day.

(21) Appl. No.: 10/788,935

(22) Filed: Feb. 27, 2004

(65) Prior Publication Data

US 2005/0189969 A1 Sep. 1, 2005

(51) Int. Cl.
*H03B 4/02* (2006.01)
(52) U.S. Cl. ...................................... 327/129
(58) Field of Classification Search ................ 327/119, 327/129, 131, 134, 135, 137, 138, 140
See application file for complete search history.

(56) References Cited

U.S. PATENT DOCUMENTS 3,350,575 A * 10/1967 Crouse ....................... 327/113
3,633,043 A * 1/1972 Anthony ..................... 327/129
3,982,189 A * 9/1976 Brooks et al. ............... 327/129
4,239,941 A * 12/1980 Gauthier et al. ............ 379/418
4,862,016 A * 8/1989 Genrich ........................ 327/94
5,243,658 A * 9/1993 Sakata ........................ 381/62
6,825,735 B1 * 11/2004 Chung ........................ 331/135

OTHER PUBLICATIONS

Chiou, et al., "Performance of GIC-Derived Active RC Biquads with Variable Gain", Department of Electrical Engineering; University of Minnesota: pp. 2-31, Feb. 2004.
Cordell, Robert R., "Build a High Performance THD Analyzer", THD Part One, Audio, pp. 34-42, Jul. 1981.

* cited by examiner

*Primary Examiner*—My-Trang Nu Ton
(74) *Attorney, Agent, or Firm*—Lee & Hayes, PLLC

(57) ABSTRACT

Embodiments of the invention provide a method and an apparatus for generating a total harmonic distortion reference signal. A triangle wave having a predetermined frequency and a predetermined amplitude is generated. The triangle wave is filtered to produce a signal substantially consisting of a sinusoid at the predetermined frequency and selected harmonics of predetermined amplitudes.

32 Claims, 4 Drawing Sheets

TOTAL HARMONIC DISTORTION STANDARD

FIELD OF THE INVENTION

This invention relates generally to signal technology and, more specifically, to signal distortion measurement.

BACKGROUND OF THE INVENTION

The Total Harmonic Distortion (THD) analyzer is the most widely used instrument for evaluation of distortion in analog signal processing equipment. A nonlinearity in a unit under test (UUT), when adequately excited by a sinusoidal wave (the fundamental) will produce, at an output of the UUT, the fundamental sinusoid along with harmonics of the fundamental sinusoid wave. The THD analyzer measures the magnitude of the harmonics to objectively describe the nonlinearity in the UUT.

Because the THD analyzer works by generating a sinusoid to input into the UUT and then removing the same sinusoid from the signal output from the UUT, it is necessary to have a uniform reference signal to produce a standardized result. Comparing the performance of THD analyzers cannot be done without a uniform input signal.

What is needed in the art, thus, is a signal generator to provide a standard reference sinusoid.

SUMMARY OF THE INVENTION

Embodiments of the invention provide a method and an apparatus for generating a total harmonic distortion reference signal. Advantageously, the present invention generates a rugged, reliable THD standard signal.

According to exemplary embodiment of the present invention, a triangle wave having a predetermined frequency and a predetermined amplitude is generated. The triangle wave is filtered to produce a sinusoid having the predetermined frequency and amplitude.

According to an aspect of the present invention, the generated triangle wave comprises a fundamental sinusoid and an infinite set of odd harmonic sinusoids. Advantageously, a presently preferred embodiment of the invention includes a bandpass filter configured to pass the fundamental sinusoid in the triangle wave. In accordance with further aspects of the invention, the fundamental frequency of the generated triangle wave along with the center frequency of the passband filter may be adjusted to produce THD at distinct frequencies.

In accordance with additional aspects of the invention, circuitry implementing an apparatus to an embodiment of the present invention may be potted in epoxy to assure thermal stability. Teflon film capacitors advantageously may be used for low loss characteristics and precision metal film resistors advantageously may be used for their low noise characteristics. Additionally, the apparatus may receive electrical power from a remote power supply to further minimize variability in the performance due to thermal effects.

In accordance with still further aspects of the invention, the bandpass filter is selected to be a generalized impedance converter configured as an active bandpass filter. The generalized impedance converter is selected because of its low sensitivity to component variation. The bandpass filter is designed as a second order active filter to pass a fundamental of the desired frequency and limited harmonic frequencies of determined amplitudes.

In accordance with still further aspects of the invention, multiple stages can be cascaded to produce further attenuation of the harmonics to achieve lower measurable harmonic amplitudes.

BRIEF DESCRIPTION OF THE DRAWINGS

The preferred and alternative embodiments of the present invention are described in detail below with reference to the following drawings.

DETAILED DESCRIPTION OF THE INVENTION

By way of overview, embodiments of the invention provide a method and an apparatus for generating a total harmonic distortion reference signal. A triangle wave having a predetermined frequency and a predetermined amplitude is generated. The triangle wave is filtered to produce a sinusoid having the predetermined frequency and amplitude.

Figure 1:
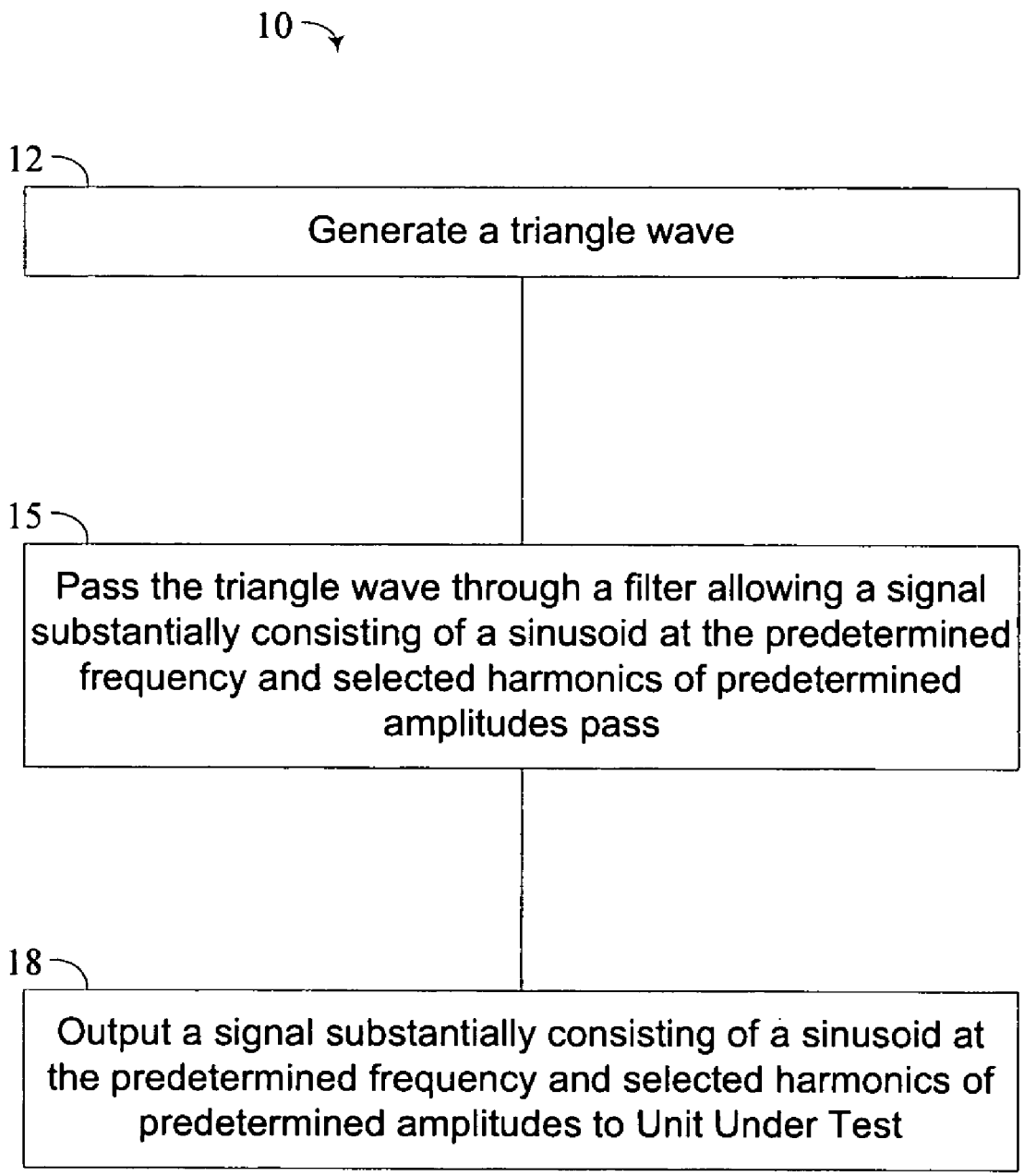
FIG. 1 is a flowchart of a method for generating a THD standard signal.

Referring to FIG. 1, a method 10 is set forth for generating a THD reference signal. At a block 12, a triangle wave is generated. As is known, triangle waves comprise a sinusoidal fundamental along with an infinite set of odd harmonic sinusoidal waves. Advantageously, integrating a square wave suitably generates a triangle wave. Oscillators such as a Schmidt-trigger 42 may be exploited to generate square waves for integration.

At a block 15, the generated triangle wave is passed through a bandpass filter. Because the first harmonic occurs at three times the frequency of the fundamental in the triangle wave, the bandpass filter reliably removes much of the harmonics leaving only the signal substantially consisting of a sinusoid at the predetermined frequency and selected harmonics of predetermined amplitudes.

Figure 2:
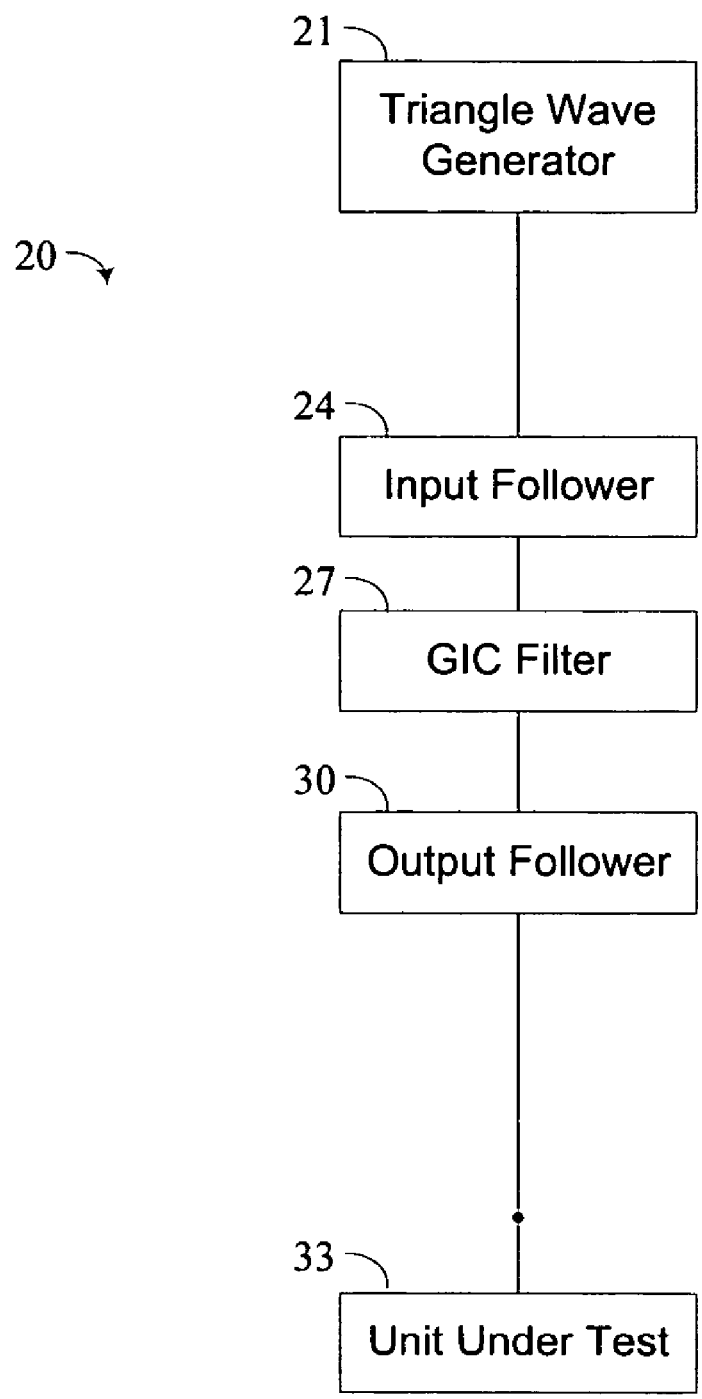
FIG. 2 is a block diagram of an apparatus for generating a standard THD signal.

At a block 18, the fundamental sinusoid is input into the unit under test (UUT) 33 (FIG. 2). The UUT 33 (FIG. 2) may be any signal processing apparatus though an analog signal processing apparatus is more sensitive to THD and therefore the more likely UUT 33 (FIG. 2). Because the harmonics have been filtered out, any harmonics that occur at the output of the UUT are as a result of nonlinearities within the UUT.

Referring now to FIG. 2, a total harmonic distortion reference signal generator 20 includes a triangle wave generator 21 that generates a triangle wave having a predetermined frequency and a predetermined amplitude. In a presently preferred embodiment, a Schmidt-trigger 42 oscillates to generate a square wave. An operational amplifier 60 configured as an integrator integrates the square wave into a triangle wave.

The triangle wave generated by the triangle wave generator 21 optionally is input into an input follower 24 if desired. The input follower 24 isolates the triangle wave generator 21 by exploiting a high input impedance of an operational amplifier 60 configured with a unity gain.

The triangle wave is output from the input follower 24 and is input into a generalized impedance converter (GIC) filter 27. In a presently preferred embodiment, a GIC filter 27 is selected for use as an active second order bandpass filter. A GIC filter 27 configuration preferably is used to exploit its inherent low sensitivity to component variation. Alternately, however, bandpass filters of other designs would be suitable so long as the design of the bandpass filter would selective pass and attenuate the harmonics the triangle wave comprises.

The GIC filter 27 passes the sinusoid to an output voltage follower 30. The output voltage follower 30, like the input voltage follower 24, advantageously may be an operational amplifier 60 set at unity gain. Because of the high impedance of the operational amplifier 60 input there is no interaction between the GIC filter 27 and a UUT 33.

At the output of the output voltage follower 30 the UUT 33 is connected to receive the fundamental sinusoid along with determined harmonics. Because of the high accuracy of the fundamental sinusoid, any harmonic distortion or "ringing" of the UUT 33 will be output with the signal at its output terminals.

Figure 3A:
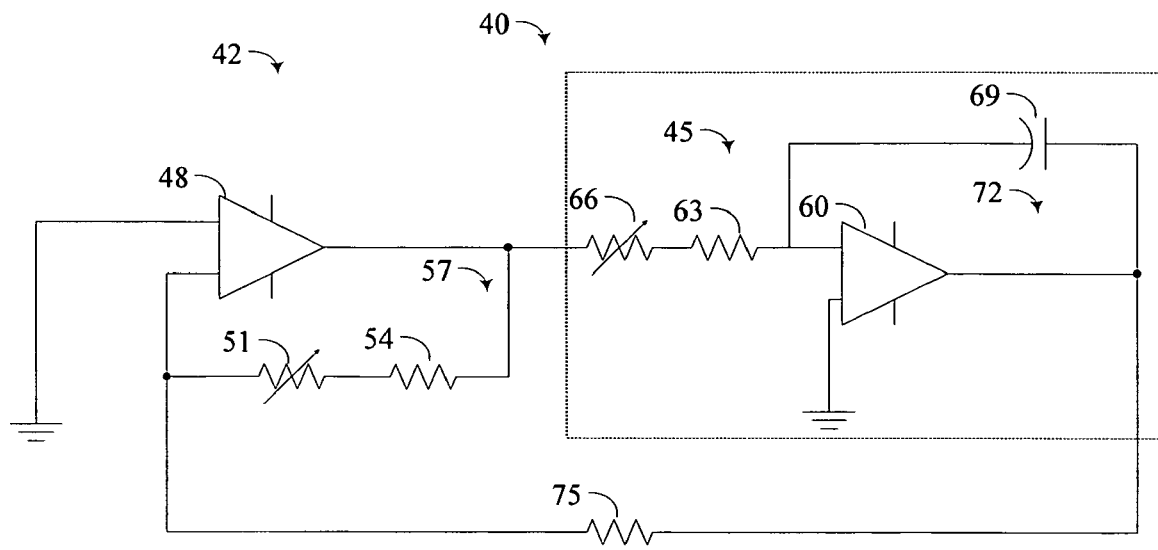
FIG. 3a is a schematic drawing of a triangle wave generator.

Referring to FIG. 3A, a triangle wave generator 21 includes a Schmidt-trigger 42 and an integrator 45. The Schmidt-trigger 42 outputs a square wave to the integrator 45. The integrator 45 integrates the square wave to a triangle wave.

The Schmidt-trigger 42 is an oscillator that is controlled by manipulating an RC time constant to exploit hystrics of the Schmidt-trigger 42. An input terminal of an inverting operational amplifier 48/60 is connected to a series connection of a variable resistor 51 and a constant value resistor 54, thereby forming a negative feedback loop 57 between an output of the operational amplifier 48/60 and the inverting input terminal of the operational amplifier 48/60. The Schmidt-trigger 42 uses the operational amplifier 48/60 as a comparator along with positive feedback to create a hysteretic switch. The variable resistor 51 and the constant value resistor 54 control the current in the negative feedback loop 57, there by causing the operational amplifier 48/60 to oscillate between a high output and a low output, thus creating a square wave. By varying resistance of the variable resistor 51, the frequency of the oscillation is controlled. A transistor is a solid state device, inasmuch as transistors comprise semiconductor materials, which are characteristic of solid state devices. Accordingly, the Schmidt trigger 42 comprising a transistor is one type of solid state switching device.

The integrator 45 includes an operational amplifier 60. The output of the operational amplifier 48/60, and therefore of the Schmidt-trigger 42, is fed to a non-inverting input terminal of the operational amplifier 60 through a series connection of a variable resistor 51 and a fixed resistor 63 that controls the current fed to the non-inverting input of the operational amplifier 60. The variable resistor 51 advantageously may be varied to control the amplitude of the square wave input into the operational amplifier 60. The fixed resistor 63 serves as a limiter for the square wave amplitude. The integrator 45 works by a charge being placed on a capacitor 69 that forms a feedback loop 72 between an output of the operational amplifier 60 and the non-inverting input of the operational amplifier 60. As the square wave alternately charges and discharges the capacitor 69, the output of the operational amplifier 60 rises and falls to form a triangular wave with a fundamental frequency equal to that of the output of the Schmidt-trigger 42.

Figure 3B:
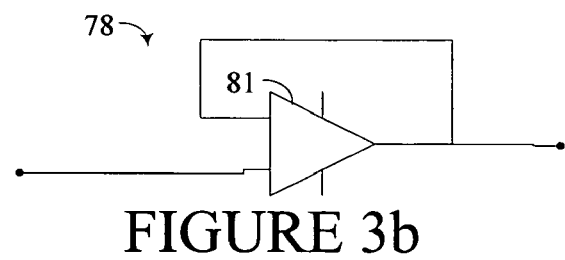
FIG. 3b is a schematic drawing of an operational amplifier configured as a voltage follower.

Referring now to FIG. 3B, an exemplary voltage follower 78 advantageously is exploited as both the input follower 24 (FIG. 2) and the output voltage follower 30 (FIG. 2). In a presently preferred embodiment, the voltage follower 78 is an operational amplifier 60/81 configured with a gain of one or unity. The voltage follower 78 thereby isolates a filter from the impedance effects of a sub-circuit from the GIC Filter 27.

Figure 4:
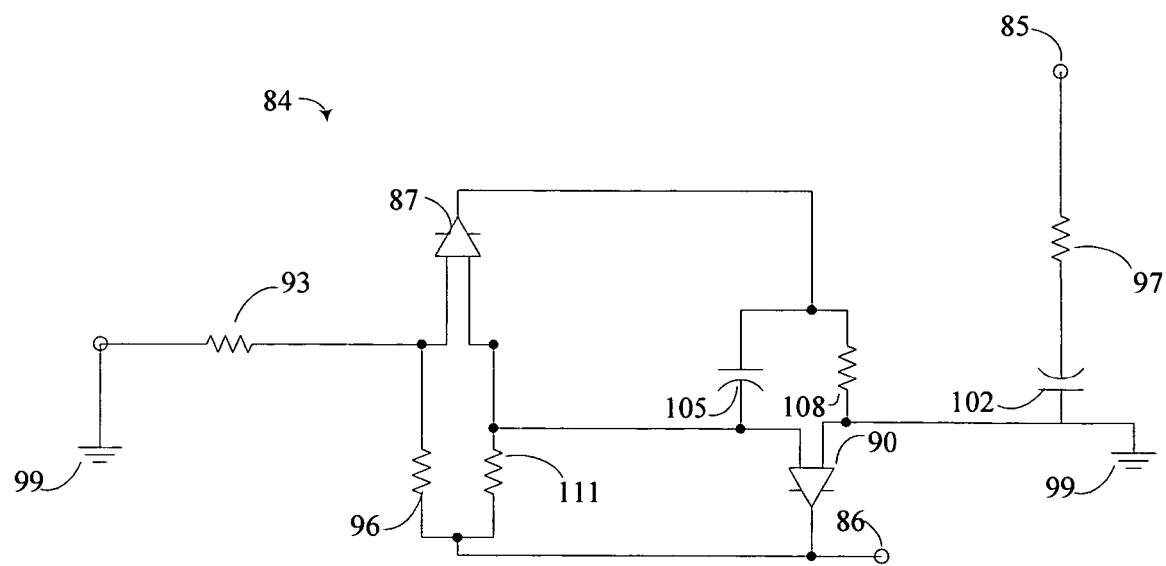
FIG. 4 is a schematic drawing of a generalized impedance converter active bandpass filter.

Referring now to FIG. 4, an exemplary active filter stage 84 filters a signal output by the output voltage follower 30 (FIG. 2). A presently preferred embodiment includes a generalized impedance converter (GIC) configured as the active filter stage 84. Because of thermal variability, non-linearity, expense, size, weight of traditional inductors as compared to integrated circuits, a presently preferred embodiment exploits an active filter in the active filter stage 84.

As is known, GICs are electronic circuits, generally configured to include operational amplifiers 60 and used to convert a first impedance at nodes in a network to a second impedance at distinct nodes of the network. GICs provide a way to get the advantages of passive circuits without the disadvantages of inductors. GIC filters provide low noise distortion, relative thermal stability as well as a very low susceptibility to component variability, and can readily be implemented as a simulated inductor in otherwise traditional passive filter designs. A simulated inductor is a circuit consisting of resistors, capacitors, and amplifiers that acts like an inductor to convert the first impedance to another by a gain factor.

As mentioned earlier, the triangle wave is a waveform comprising a fundamental and an infinite set of odd harmonic sine waves. In a presently preferred embodiment, a second-order bandpass filter configuration is selected to suitably remove much of the harmonic sine waves from the triangle wave leaving a pure fundamental sinusoid along with harmonics of determined amplitude, though the invention is not limited to the second-order configuration.

A presently preferred embodiment includes the active filter stage 84 configured as a frequency-dependent negative resistance (FDNR) with two operational amplifiers 87 and 90. The FDNR results from RC-active simulation of passive ladders and involves the transformation of a prototype ladder into a form suitable for active realization. A most effective method of this class is based on use of the Bruton transformation, which involves the complex impedance scaling of a prototype passive induction capacitive-resistance (LCR) ladder network. All prototype circuit impedances Z(s) are transformed to $Z_T(S)$, a transform function still dependent on s with $$Z_T(s) = \frac{K}{s} \cdot Z(s) \quad (1)$$

where K is a constant chosen by the designer and which provides the capacity to scale component values in the final filter. Because impedance transformations do not affect voltage and current transfer ratios, the voltage transfer function remains unaltered by this change. For instance, when Bruton transformation is applied directly to the elements in the prototype network, it follows from Eq. (1) that a resistance R transforms into a capacitance C=K/R, while an inductance L transforms into a resistance R=KL. The elimination of inductors in favor of resistors is the key purpose of the Bruton transform method. Applying the Bruton transform to a prototype circuit capacitance C gives $$Z_T(s) = \frac{K}{s} \cdot Z(s) = \frac{K}{s} \cdot \frac{1}{sC} = \frac{K}{s^2C} = \frac{1}{s^2D} \quad (2)$$

where D=C/K is the parameter value of a new component produced by the transformation, which is usually referred to as a FDNR. This name results from the fact that the sinusoidal steady-state impedance $$Z_T(j\omega) = -\left(\frac{1}{\omega^2 D}\right) \quad (3)$$

is frequency-dependent, negative, and real, hence, resistive. Placing a capacitor in the feedback loop 72 at the non-inverting input of operational amplifiers 87 and 90 can form a low pass filter. Placing a capacitor in series with an inverting input of operational amplifiers 87 and 90 can form a high pass filter. In practice, the GIC elements are realized by RC-active subnetworks using operational amplifiers 87 and 89, normally two operational amplifiers 87 and 90 are used to create an FDNR. The active filter stage 84 receives a signal from the input follower 24 (FIG. 2) at an input 85 and outputs a signal to an output voltage follower 30 at an output 86.

Advantageously, the active filter stage 84 configured as a frequency-dependent negative resistance (FDNR) with two operational amplifiers 87 and 90 can be appropriately tuned to a desired frequency ($f_0$) by measuring the actual frequency ($f_a$), gain ($H_a$), and Q-factor ($Q_a$). By selecting resistors 96, 111 appropriately, the actual frequency ($f_a$) can be made to substantially coincide with the desired frequency ($f_0$). Selecting a change $\Delta$ in the resistors 96, 111 is accomplished according to the relationship:

$$\Delta R_{111} = \frac{(2-H)(2R_{111})}{H} \text{ and} \quad (4)$$

$$\Delta R_{96} = \frac{(f_a^2 - f_0^2)(R_{111} + \Delta R_{111})}{f_0^2} + R_{111} \quad (5)$$

To solve for the actual frequency ($f_a$) of a system, one takes the measured values for each of the resistances $R_{96}$, $R_{111}$, and the capacitances $C_{102}$ and $C_{105}$ according to Equations (6) and (7):

$$f_0^2 = \frac{R_{111} + \Delta R_{111}}{4\pi^2 R_{111}^2 (R_{111} + \Delta R_{111} + \Delta R_{96}) C_{105} C_{102}} \text{ where} \quad (6)$$

$$f_0^2 = \frac{f_a^2(R_{111} + \Delta R_{111})}{R_{111} + \Delta R_{96}} \quad (7)$$

The Q factor is a measure of the relationship between stored energy and rate of energy dissipation in certain electrical components, and devices, thus indicating their efficiency. A Q factor can be selected according to the following relationship:

$$\Delta R_{97} = \frac{R_{97}(Q_0 - Q_a)}{Q_0} \quad (8)$$

Another way to describe the relationship is in terms of frequencies:

$$\Delta R_{96} = \frac{R_{96}(f_a^2 - f_0^2)}{f_0^2} \quad (9)$$

Resistors 93, 96, 97, 108, and 111 and Capacitors 102 and 105 are selected to have substantially equal measured values in order to optimize the filter operation. Thus, the relationship simplifies to:

$$f_0 = \frac{1}{2\pi RC} \quad (10)$$

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for generating a total harmonic distortion reference signal, the method comprising:
   generating a triangle wave having a predetermined frequency and a predetermined amplitude; and
   providing a band-pass filter configured to pass the predetermined frequency;
   filtering the triangle wave through the band-pass filter to produce a sine wave having the predetermined frequency and amplitude.

2. The method of claim 1, wherein generating the triangle wave further includes:
   generating a square wave at the predetermined frequency; and
   integrating the square wave into the triangle wave.

3. The method of claim 2, wherein generating a square wave includes activating and deactivating a solid-state switching device.

4. The method of claim 3, wherein the solid-state switching device includes a transistor.

5. The method of claim 2, wherein integrating the square wave includes inputting a square wave to an operational amplifier.

6. The method of claim 1, wherein filtering the triangle wave passes a signal substantially consisting of a sinusoid at the predetermined frequency and selected harmonics of predetermined amplitudes.

7. The method of claim 6, wherein the predetermined frequency is selected from a plurality of frequencies.

8. An apparatus for generating a total harmonic distortion reference signal, the apparatus comprising:
   a triangle wave generator configured to generate a triangle wave having a predetermined frequency; and
   a bandpass filter configured to receive the triangle wave from the triangle wave generator, the filter being configured to pass a signal substantially consisting of a sine wave at the predetermined frequency and selected harmonics of the sine wave having predetermined amplitudes.

9. The apparatus of claim 8, wherein the triangle wave generator is configured to receive a clock signal.

10. The apparatus of claim 9, wherein the clock signal is an integer multiple of the desired frequency.

11. The apparatus of claim 8, wherein the predetermined frequency includes a frequency selected from a plurality of frequencies.

12. The apparatus of claim 11, wherein the predetermined frequency is adjustably selected from a plurality of frequencies.

13. The apparatus of claim 8, wherein the triangle wave generator includes:
   a square wave generator configured to generate a square wave having the predetermined frequency; and
   an integrator configured to integrate the square wave into the triangle wave.

14. The apparatus of claim 8, further comprising an input voltage follower configured to input a first signal from the output of the triangle wave generator and to output to the filter a second signal based upon the first signal.

15. The apparatus of claim 8, further comprising an output voltage follower configured to receive a third signal from the filter and to output a fourth signal based upon the third signal.

16. The apparatus of claim 13, wherein the square wave generator includes a solid-state switching device.

17. The apparatus of claim 13, wherein the integrator receives a square wave at an input of an operational amplifier.

18. The apparatus of claim 8, wherein the bandpass filter is configured to pass a signal substantially consisting of a sinusoid at the predetermined frequency and selected harmonics of predetermined amplitudes.

19. The apparatus of claim 18, wherein the predetermined frequency is a frequency predetermined from a plurality of frequencies.

20. An apparatus for generating a total harmonic distortion reference signal, the apparatus comprising:
   a Schmidt trigger oscillator configured to output a square wave;
   an integrator configured to integrate the square wave into a triangle wave; and
   a generalized impedance converter configured to bandpass filter the triangle into a signal substantially consisting of a sinusoid at the predetermined frequency and selected harmonics of predetermined amplitudes.

21. The apparatus of claim 20, wherein the generalized impedance converter is further configured as an active bandpass filter.

22. The apparatus of claim 21, wherein the active bandpass filter is a second order filter.

23. The apparatus of claim 20, wherein a first voltage follower inputs the triangle wave from the integrator and outputs the triangle wave to the generalized impedance converter.

24. The apparatus of claim 20, wherein a second voltage follower inputs the sinusoid wave from the generalized impedance converter and outputs the signal substantially consisting of a sinusoid at the predetermined frequency and selected harmonics of predetermined amplitudes to a unit under test.

25. The apparatus of claim 20, wherein the Schmidt trigger includes a metal film resistor.

26. The apparatus of claim 20, wherein the integrator includes a Teflon film capacitor.

27. The apparatus of claim 20, wherein the generalized impedance converter includes a metal film resistor.

28. The apparatus of claim 20, wherein the generalized impedance converter includes a Teflon film capacitor.

29. The apparatus of claim 20, wherein the Schmidt trigger includes an integrated circuit operational amplifier.

30. The apparatus of claim 20, wherein the integrator includes an integrated circuit operational amplifier.

31. The apparatus of claim 20, wherein the generalized impedance converter includes an integrated circuit operational amplifier.

32. The apparatus of claim 20, wherein the apparatus is potted.

* * * * *